United States Patent [19]

Torikai

[11] Patent Number: 5,057,891
[45] Date of Patent: Oct. 15, 1991

[54] PLANAR HETEROJUNCTION AVALANCHE PHOTODIODE

[75] Inventor: Toshitaka Torikai, Tokyo, Japan

[73] Assignee: NEC Corporation, Tokyo, Japan

[21] Appl. No.: 653,487

[22] Filed: Feb. 12, 1991

Related U.S. Application Data

[63] Continuation of Ser. No. 302,132, Jan. 26, 1989, abandoned, which is a continuation of Ser. No. 863,908, May 16, 1986, abandoned.

[30] Foreign Application Priority Data

May 20, 1985 [JP] Japan .................... 60-108634
May 21, 1985 [JP] Japan .................... 60-108661

[51] Int. Cl.$^5$ .................... H01L 27/14; H01L 31/00
[52] U.S. Cl. .................... 357/30; 357/13; 357/20; 357/52
[58] Field of Search .................... 357/13, 30 A, 52, 20, 357/16

[56] References Cited

U.S. PATENT DOCUMENTS

| 4,383,266 | 5/1983 | Sakai et al. | 357/13 |
| 4,651,187 | 3/1987 | Sugimoto et al. | 357/13 |
| 4,684,969 | 8/1987 | Taguchi | 357/16 |

OTHER PUBLICATIONS

T. Torikai et al, "Low Noise . . . Epitaxy", 10th European Conference on Optical Communication, Sep. 3–6, 1984.

Matsushima et al., "High . . . Structure", Electronics Letters, vol. 20, No. 6, Mar. 15, 1984, pp. 235–236.

Surai et al., "In GaAs APD . . . Region", Electronics Letters, vol. 19, No. 14, Jul. 7, 1983, pp. 534–536.

Primary Examiner—Edward J. Wojciechowicz
Assistant Examiner—Sara W. Crane
Attorney, Agent, or Firm—Sughrue, Mion, Zinn, Macpeaks & Seas

[57] ABSTRACT

A planar heterojunction avalanche photodiode (APD) having a first semiconductor layer of a first conductivity type for generating carriers by absorbing light, a second semiconductor layer of the same first conductivity type having an impurity concentration which decreases with the distance from the first semiconductor layer and a bandgap greater than that of the first semiconductor layer for avalanche-multiplying the carriers injected from the first semiconductor layer. A first semiconductor region of a second conductivity type is diffused in the second semiconductor layer at a prescribed depth from the upper surface of the second semiconductor layer thus forming a stepwise p-n junction. A guard-ring of the second conductivity type is formed in the second semiconductor layer to overlap the circumferential part of the first semiconductor region and forming a linearly graded p-n junction with the second semiconductor layer in a position closer to the first semiconductor layer than the stepwise p-n junction.

9 Claims, 1 Drawing Sheet

PLANAR HETEROJUNCTION AVALANCHE PHOTODIODE

This is a continuation of application Ser. No. 07/302,132 filed Jan. 26, 1989, which is a continuation of application Ser. No. 06/863,908 filed May 16, 1986 both now abandoned.

BACKGROUND OF THE INVENTION

The present invention relates to a planar heterojunction avalanche photodiode having a guard ring.

The development of an avalanche photodiode (APD) using an $In_{0.53}Ga_{0.47}As$ semiconductor is under way for optical communications in the 1 to 1.6 micron wavelength region, where the transmission loss of optical fibers is relatively small. Such a heterojunction APD uses a heterojunction of $In_{0.53}Ga_{0.47}As$ and InP, which permit lattice matching to each other. The InGaAs layer, whose bandgap is smaller, is used for light absorption, and either the electron or the positive hole carriers, generated therein by optical excitation, are transported to the p-n junction in the InP for avalanche multiplication. For this kind of APD, usually a planar structure is used, wherein a $p^+$ region is selectively diffused in n-InP to form a stepwise p-n junction. However, there is the problem that, when a reverse bias is applied to the p-n junction, the electric field will most readily concentrate in the circumferential part of the diffused region, resulting in an earlier breakdown than in the p-n junction of the flat part of the diffused region, which is closer to the light receiving area. This phenomenon is known as edge breakdown. To prevent this edge breakdown there is proposed an arrangement in which the circumference of the diffused region is surrounded by a guard-ring of a linearly graded p-n junction, whose breakdown voltage is relatively high.

T. Shirai et al. attempted to prevent edge breakdown by so forming a guard-ring that its linearly graded p-n junction front reaches the same depth as a stepwise p-n junction (T. Shirai et al., "InGaAs Avalanche Photodiodes for 1 μm Wavelength Region", ELECTRONICS LETTERS, 7th July 983, Vol. 19, No. 14, pp. 534–535). However, while the depletion layer in a stepwise p-n junction, upon application of a reverse bias, grows unidirectionally into an n-conductivity region, the depletion layer in a linearly graded p-n junction grows into both p- and n-conductive regions. As a consequence, the problem arises that a contour having a positive curvature emerges in the depletion layer resulting from the two p-n junctions, and an electric field concentrates on the positive curvature region there inviting edge breakdown.

T. Torikai et al. tried to prevent edge breakdown by forming the linearly graded p-n junction front of a guard ring in an even deeper position than the stepwise p-n junction (T. Torikai et al., "Low Noise and High Speed InP/InGaAsP/InGaAs Avalanche Photodiodes with Planar Structure Grown by Vapor Phase Epitaxy", 10th European Conference on Optical Communication, Stuttgart, Sept. 3–6, 1984, Conference Proceedings, pp. 220–221). However, since the guard ring of the linearly graded p-n junction in this structure is positioned close to the InGaAsP layer whose bandgap is smaller, it is susceptible to edge breakdown from the depletion layer's edge of the guard-ring's p-n junction, so that the front position of the linearly graded p-n junction requires critical control.

In the U.S. Pat. application Ser. No. 713,669 or EPC Application No. 85103299.5 jointly filed with the present inventor, there is proposed an APD in which edge breakdown is prevented by providing two linearly graded p-n junctions and easing the curvature of the p-n junction depletion layer jointly formed by a stepwise p-n junction and the two linearly graded p-n junctions. This structure, however, requires a process to produce two guard-rings. Moreover, since it demands a highly precise exposure alignment of the outer guard-ring to the inner one, there are problems of difficult processing and lower element yield.

Furthermore, in every one of the aforementioned prior art examples, the stepwise $p^+$-n junction front is arranged in a high-concentration n-InP layer or at the interface between low-concentration n-InP and high-concentration n-InP layers, so that noise reduction is restricted.

SUMMARY OF THE INVENTION

An object of the present invention, therefore, is to provide a heterojunction APD with guard-ring, which is free from the disadvantages mentioned above and yet effectively protected from edge breakdown.

Another object of the invention is to provide a heterojunction APD permitting further noise reduction.

According to the invention, there is provided a planar heterojunction avalanche photodiode (APD) including a first semiconductor layer of a first conductivity type for generating carriers by absorbing light; a second semiconductor layer of the first conductivity type for avalanche-multiplying the carrier injected from the first semiconductor layer, wherein the impurity concentration decreases with the distance from the first semiconductor layer and whose bandgap is greater than that of the first semiconductor layer; a first semiconductor region of a second conductivity type, diffused in the second semiconductor layer at a prescribed depth from the upper face of the second semiconductor layer and forming a stepwise p-n junction on the interface with the second semiconductor layer; and a guard-ring of the second conductivity type, formed in the second semiconductor layer by ion implantation from the upper face of the second semiconductor layer to overlap the circumferential part of the first semiconductor region and forming a linearly graded p-n junction with the second semiconductor layer in a position closer to the first semiconductor layer than the stepwise p-n junction.

In a more specific structure according to the invention, the impurity distribution in the second semiconductor layer varies in a stepwise manner. In another structure, the impurity concentration in the second semiconductor layer decreases continuously.

According to the invention, the impurity concentration in the avalanche-multiplying layer gradually decreases with the distance from the light absorption layer. Therefore, the positive curvature of the guard-ring, formed by ion implantation followed by heat treatment, can be eased, so that a single guard-ring can raise the breakdown voltage of the guard-ring itself. Furthermore, since the stepwise $p^+$-n junction front can be formed in a position of a medium impurity concentration region in the avalanche layer, the difference between the ionization rate of electrons and that of positive holes can be enlarged, resulting in a low-noise APD.

DETAILED DESCRIPTION OF THE PREFERRED EMBODIMENTS

Figure 1:
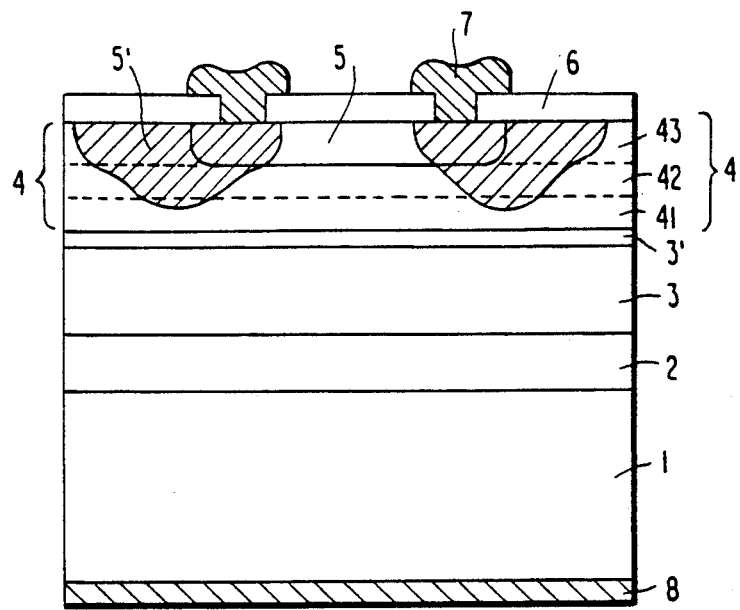
FIG. 1 shows a cross-sectional view of a first preferred embodiment of the present invention.

With reference to FIG. 1, an APD comprises an n-InP buffer layer 2 (about 1 micron thick), an n—In$_{0.53}$Ga$_{0.43}$As layer 3 (3.5 to 4.0 microns thick) of 3 to $5 \times 10^{15}$ cm$^{-3}$ in carrier concentration, and an InGaAsP layer 3' (about 1 micron thick) having a bandgap corresponding to a wavelength of 1.3 microns, successively grown over a sulphur-doped n$^+$-InP substrate 1. An n-InP layer 4 consists of an n-InP layer 41 (0.7 to 1.0 micron thick) of 3 to $4 \times 10^{16}$ cm$^{-3}$ in carrier concentration, an n$^-$-InP layer 42 (about 1 micron thick) of 3 to $7 \times 10^{15}$ cm$^{-3}$ in carrier concentration, and an n$^{--}$-InP layer 43 (1 to 1.5 microns thick) of 1 to $2 \times 10^{15}$ cm$^{-3}$ in carrier concentration. The n-InP buffer layer 2 is intended to prevent any defect or dislocation in the InP substrate 1 from reaching the layers 3 to 43 during the process of layer growth; The n$^-$-InGaAs layer 3, absorbs light of 1 to 1.7 microns in wavelength and generates positive hole and electron carriers. The n-InGaAsP layer 3'. Prevents the traveling delay of the positive hole carriers due to the valence electron band discontinuity between the InP layer 4 and the InGaAs layer 3. The n-InP layers 41, 42 and 43 are avalanche multiplying layers. In the central part of the n$^{--}$-InP layer 43 is a p$^+$ type conductive region 5 (about 80 microns in diameter) selectively provided in a round or an oval shape as viewed from above and a guard-ring 5' (about 100 microns in outer diameter) provided in a ring shape around the circumference of the p$^+$ region 5. A p-electrode 7 is provided in a ring shape through a surface-protective film 6 with a selectively opened window in the p$^+$ type conductivity region 5, and an n-electrode 8 is formed all over the lower face of the substrate 1.

The layers 2, 3, 3', 41, 42 and 43 were grown over the InP substrate 1, etched with a mixture of H$_2$SO$_4$, H$_2$O and H$_2$O$_2$ in a 3:1:1 ratio, by the hydride vapor phase epitaxial method in a reactor (not shown) combining an InP growth chamber, an InGaAsP growth chamber and an InGaAs growth chamber at a substrate temperature of 700° C. After the epitaxial layer growth, the guard-ring was formed by implanting beryllium ions in the following process. Beryllium was used because it lends itself to the formation of a p-n junction closest to linear grading. An SiO$_2$ film was formed to a thickness of about 1 μm over the layer 43 by the pyrolitic chemical vapor phase deposition method (thermal CVD method) at 370° C., and a window was selectively opened into said SiO$_2$ film with buffered fluoric acid solution by the use of an exposure mask for forming the guard-ring 5' on which a ring-shaped pattern was drawn by a usual light-exposure technique. After that, beryllium ions were implanted within an accelerating voltage range of 100 to 140 KV and at a dose of $5 \times 10^{13}$ cm$^{-2}$. At this time, the beryllium ions were implanted into the InP crystals, exposed by the opening selectively bored into the SiO$_2$ film. In this stage, they were substantially evenly distributed within the window in the exposure mask and at a depth about 0.3 micron from the surface of the n$^{--}$-InP layer 43. The SiO$_2$ film was removed by etching with the fluoric acid solution; then a phosphorated silica glass (PSG) layer was formed to a thickness of about 100 nm at 370° C. by the thermal CVD method, and thermal treatment for activation and drive-in diffusion of the beryllium ions was conducted for about 20 minutes at 700° C., resulting in the formation of the guard-ring 5' in the illustrated shape. The lower the impurity concentration in the n-InP, the more extensive the diffusion of beryllium. Since the impurity concentration in the n-InP layer increases with the distance from the surface, the overall guard-ring shape had an eased positive curvature as illustrated.

After that, cadmium was thermally diffused within the guard-ring 5' for 20 to 30 minutes at a temperature of 570° C. through the PSG film, into which a circular window had been selectively opened by the use of an exposure mask, to so form the p$^+$ type conductivity region 5 that the stepwise p$^+$-n junction would be positioned at the interface between the n$^{--}$-InP layer 43 and the n$^-$-InP layer 42 or within the n$^-$-InP layer 42.

Next, after the PSG film used for thermal diffusion was removed by etching with fluoric acid solution, the SiN surface-protective film 6 was plasma-deposited at 300° C. to a thickness of 150 to 200 nm. After that, a window was opened over the p$^+$ type conductive region 5 by the use of an exposure mask, on which a ring-shaped pattern had been drawn by a light-exposure technique, and the p-electrode 7 was formed by successively laying titanium, platinum and gold by the electron-bombardment evaporation method to thicknesses of 100 nm, 100 nm and 300 nm, respectively. Further, the n-electrode 8 of AuGe/Ni alloy was formed all over the lower face of the substrate by the resistive heating evaporation method to finish the APD.

Figure 2:
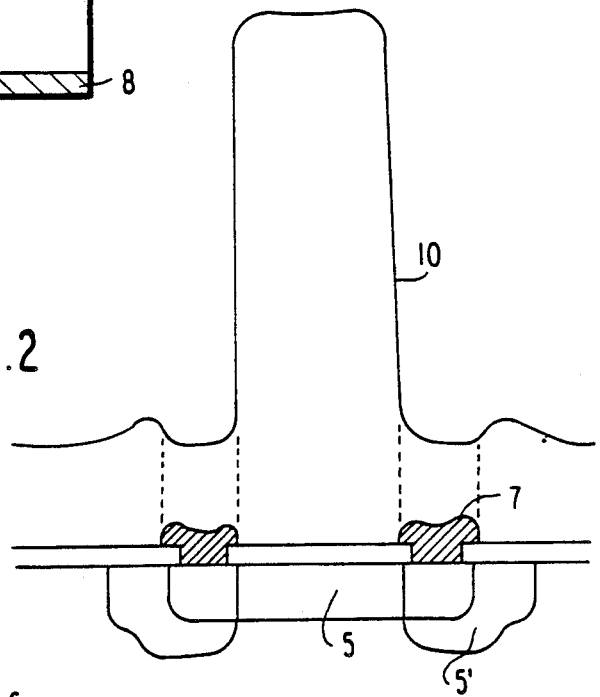
FIG. 2 is a chart showing the spatial gain distribution in the APD illustrated in FIG. 1.

To check the breakdown voltage of the guard-ring, a wafer having the same epitaxial structure was used to separately form a linearly graded p-n junction by beryllium ion implantation simultaneously with the aforementioned process. The breakdown voltage of this linearly graded p-n junction ranged from 120 to 150 V. That of the finished APD element was within the range of 100 to 110 V, lower than the 120 to 150 V range of the guard-ring section. Accordingly, avalanche multiplication of carriers was sufficiently achieved at the stepwise p$^+$-n junction corresponding to the light receiving region surrounded by the ring-shaped p-electrode 7. This condition is illustrated in FIG. 2, where reference numeral 10 represents a typical multiplication sensitivity distribution, revealing that the carrier multiplication is greater in the stepwise p$^+$-n junction corresponding to the light receiving region than in the guard-ring section.

Furthermore, the APD according to the present invention is much less susceptible to noise than any prior art APD. A low-noise APD can be realized by increasing the difference between electrons' ionization rate $\alpha$ and positive holes' $\beta$. In the avalanche multiplying layer InP, $\beta$ is greater than $\alpha$, so that noise can be reduced by enlarging the $\beta/\alpha$ ratio. Since the $\beta/\alpha$ ratio is a function of the electric field, and the lower the electric field, the greater the $\beta/\alpha$ ratio, noise can be reduced by lowering the electric field in the avalanche multiplying layer InP. The electric field is a function of the impurity concentration, and the lower the impurity concentration in the avalanche region, the lower the electric field, resulting in noise reduction.

As the stepwise $p^+$-n junction is positioned in the n-InP layer 42, having a medium impurity concentration, according to the invention, the excess noise factor (x-value) is expected to be somewhere between 0.5 and 0.6, representing a substantial improvement over the 0.7 to 0.8 of the prior art structure, where the $p^+$-n junction is positioned in a high impurity concentration layer.

Figure 3:
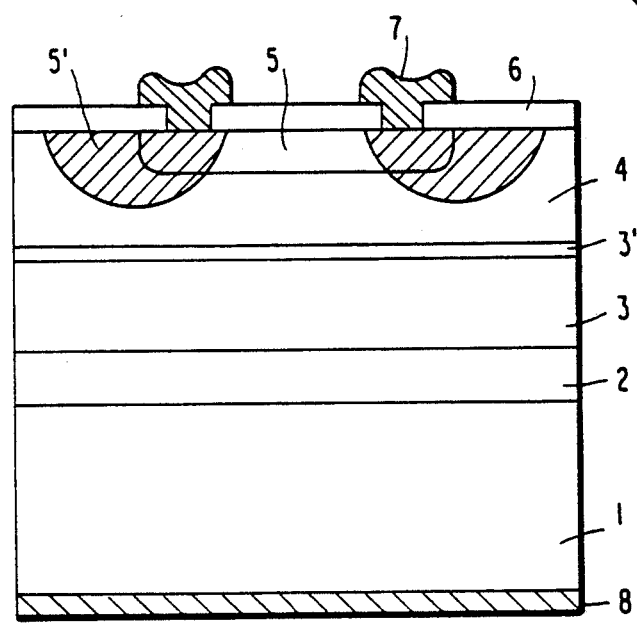
FIG. 3 shows a cross-sectional view of a second preferred embodiment of the invention.

FIG. 3 shows a cross-sectional view of a second preferred embodiment of the present invention. The APD illustrated herein differs from the structure of FIG. 1 in that the impurity concentration of the n-InP layer 4 gradually decreases with the distance from the InGaAs light absorbing layer 3 and, consequently, in the shape of the guard-ring 5'. Since the two embodiments are alike in other respects, only these differences will be described in detail below.

The n-InP layer 4 has an impurity concentration of about $5 \times 10^{16}$ cm$^{-3}$ on its interface with the InGaAsP intermediate layer and an impurity concentration of approximately $1 \times 10^{15}$ cm$^{-3}$ at the uppermost level of the epitaxial structure, and the impurity concentration in-between gradually and continuously decreases toward the upper surface. Beryllium ion implantation in the n-InP layer 4, which has this distribution of carrier concentration, in the same process as that for the first preferred embodiment, illustrated in FIG. 1, followed by heat treatment, results in the formation of a guard-ring, whose positive curvature is also eased according to the distribution of impurity concentration in the n-InP layer 4.

The formation of the $p^+$ type conductivity region 5 is also achieved under the same conditions as those for the first preferred embodiment, the stepwise $p^+$-n junction being positioned in an InP region whose impurity concentration is 3 to $5 \times 10^{15}$ cm$^{-3}$.

This preferred embodiment can be expected to give the same benefits as the first.

What is claimed is:

1. A planar heterojunction avalanche photodiode (APD) including:
    a first semiconductor layer of a first conductivity type for generating carriers by absorbing light;
    a first semiconductor region of the first conductivity type overlying said first semiconductor layer for avalanche-multiplying the carriers injected from said first semiconductor layer, said first semiconductor region having at least a lower semiconductor layer, an intermediate semiconductor layer formed on said lower semiconductor layer and an upper semiconductor layer formed on said intermediate semiconductor layer wherein the impurity concentration of said upper semiconductor layer is lower than that of said intermediate semiconductor layer whose impurity concentration is lower than that of said lower semiconductor layer said intermediate semiconductor layer has a thickness of about 1 micron providing a substantially constant impurity concentration region and the bandgap of said first semiconductor region is greater than that of said first semiconductor layer;
    a second semiconductor region of a second conductivity type, diffused in said first semiconductor region at a prescribed depth from the upper face of said first semiconductor region and forming a stepwise p-n junction on the interface with said first semiconductor region; and
    a guard-ring of said second conductivity type, formed in said first semiconductor region by ion implantation from the upper face of said first semiconductor region and forming a linearly graded p-n junction with said first semiconductor region and reaching said lower semiconductor layer by extending through said upper and intermediate semiconductor layers.

2. An APD, as claimed in claim 1, further including a substrate underlying said first semiconductor layer of a first conductivity type and a buffer layer of said first conductivity type positioned between said substrate and said first semiconductor layer of a first conductivity type.

3. An APD, as claimed in claim 2, wherein a first electrode is provided on a face of said substrate opposite said buffer layer.

4. An APD, as claimed in claim 1, wherein a surface-protective film is provided on top of said second semiconductor layer.

5. An APD, as claimed in claim 4, further including a second electrode extending through said surface-protective film, and contacting said second semiconductor region of a second conductivity type, said second electrode being ring shaped.

6. A planar heterojunction avalanche photodiode (APD) including:
    a first semiconductor layer of a first conductivity type for generating carriers by absorbing light;
    a first semiconductor region of the first conductivity type overlying said first semiconductor layer for avalanche-multiplying the carriers injected from said first semiconductor layer, said first semiconductor region having at least a lower semiconductor layer, an intermediate semiconductor layer formed on said lower semiconductor layer and an upper semiconductor layer formed on said intermediate semiconductor layer wherein the impurity concentration of said upper semiconductor layer is lower than that of said intermediate semiconductor layer whose impurity concentration is lower than that of said lower semiconductor layer, said intermediate semiconductor layer has a thickness providing a substantially constant impurity concentration except for interface regions of said intermediate semiconductor layer with neighboring semiconductor layers, and the bandgap of said first semiconductor region is greater than that of said first semiconductor layer;
    a second semiconductor region of a second conductivity type, diffused in said first semiconductor region at a prescribed depth from the upper face of said first semiconductor region and forming a stepwise p-n junction of the interface with said first semiconductor region; and
    a guard-ring of said second conductivity type, formed in said first semiconductor region by ion implantation from the upper face of said first semiconductor region to overlap the circumferential part of said second semiconductor region and forming a linearly graded p-n junction with said first semiconductor region and reaching said lower semiconductor layer by extending through said upper and intermediate semiconductor layers.

7. A planar heterojunction avalanche photodiode as set forth in claim 6, wherein the thickness of said intermediate semiconductor layer is at most 1 micron.

8. In a planar heterojunction avalanche photodiode, said avalanche photodiode comprising:

a first semiconductor layer of a first conductivity type for absorbing light;

a first semiconductor region of said first conductivity type overlying said first semiconductor layer, said first semiconductor region having at least a lower semiconductor layer, an intermediate semiconductor layer formed on said lower semiconductor layer and an upper semiconductor layer formed on said intermediate semiconductor layer, and having a greater bandgap than said first layer, wherein the impurity concentration of said upper semiconductor layer is lower than that of said intermediate semiconductor layer whose impurity concentration is lower than that of said lower semiconductor layer, and said intermediate semiconductor layer has a thickness providing a substantially constant impurity concentration except for interface regions with neighboring semiconductor layers;

a second semiconductor region of a second conductivity type, having a substantially higher impurity concentration than said first semiconductor region and formed in a portion of said first semiconductor region to provide a circumferential boundary and a front boundary defining said second semiconductor region, wherein a substantially stepwise p-n junction is formed between said first semiconductor region and said second semiconductor region;

a guard-ring region of a second conductivity type for preventing edge-breakdown of said second semiconductor region, said guard-ring region formed by ion implantation in a ring-shape and surrounding the periphery of said first semiconductor region to overlap said circumferential boundary of said first semiconductor region and to extend beyond said front boundary of said second region, wherein a substantially graded p-n junction is formed with said first semiconductor region and reaching said lower semiconductor layer by extending through said upper and intermediate semiconductor layers.

9. In a planar heterostructure avalanche photodiode, said avalanche photodiode comprising:

a first semiconductor layer of a first conductivity type for absorbing light;

a first semiconductor region of said first conductivity type overlying sia first semiconductor layer, said first semiconductor region having at least a lower semiconductor layer, an intermediate semiconductor layer formed on said lower semiconductor layer and an upper semiconductor layer formed on said intermediate semiconductor layer, and having a greater bandgap than said first layer, for avalanche multiplying the carriers injected from said first semiconductor layer, wherein the impurity concentration of said upper semiconductor layer is lower than that of said intermediate semiconductor layer whose impurity concentration is lower than that of said lower semiconductor layer and sad intermediate semiconductor layer has a thickness providing a substantially constant impurity concentration except for interface regions with neighboring semiconductor layers;

a second semiconductor region of a second conductivity type, having a substantially higher impurity concentration than said first semiconductor region and formed in a portion of said first semiconductor region to provide a circumferential boundary and a front boundary defining said second semiconductor region, wherein a substantially stepwise p-n junction is formed between said first semiconductor region and said second semiconductor region;

a guard-ring region of a second conductivity type for preventing edge-breakdown of said second semiconductor region, said guard-ring region formed by ion implantation in a ring-shape and surrounding the periphery of said first semiconductor region to overlap said circumferential boundary of said first semiconductor region and to extend beyond said front boundary of said second region, wherein a substantially graded p-n junction is formed with said first semiconductor region and reaching said lower semiconductor layer by extending through said upper and intermediate semiconductor layers.

* * * * *